(12) United States Patent
Lin et al.

(10) Patent No.: US 11,038,491 B2
(45) Date of Patent: Jun. 15, 2021

(54) POWER SWITCHING APPARATUS

(71) Applicant: Artilux, Inc., Menlo Park, CA (US)

(72) Inventors: Shao-Hung Lin, Hsinchu County (TW); Li-Gang Lai, Hsinchu County (TW)

(73) Assignee: Artilux, Inc., Menlo Park, CA (US)

( * ) Notice: Subject to any disclaimer, the term of this patent is extended or adjusted under 35 U.S.C. 154(b) by 0 days.

(21) Appl. No.: 17/009,798

(22) Filed: Sep. 2, 2020

(65) Prior Publication Data
US 2021/0067143 A1 Mar. 4, 2021

Related U.S. Application Data

(60) Provisional application No. 62/894,984, filed on Sep. 3, 2019.

(51) Int. Cl.
*H03B 1/00* (2006.01)
*H03K 3/00* (2006.01)
*H03K 3/01* (2006.01)
*H03K 17/687* (2006.01)

(52) U.S. Cl.
CPC ........... *H03K 3/01* (2013.01); *H03K 17/6871* (2013.01)

(58) Field of Classification Search
CPC .............................. H03K 3/01; H03K 17/6871
USPC .......................................................... 327/109
See application file for complete search history.

(56) References Cited

U.S. PATENT DOCUMENTS 10,749,487 B2 * 8/2020 Penticoff ................. H03F 3/195

* cited by examiner

*Primary Examiner* — Metasebia T Retebo
(74) *Attorney, Agent, or Firm* — Dority & Manning, P.A.

(57) ABSTRACT

In a power switching apparatus, a first switch includes a first end coupled to a first input terminal, a second end coupled to an output terminal, and a control end coupled to a second input terminal and coupled to a ground via a first resistor. A second resistor is coupled between the output terminal and the ground. A second switch includes a first end coupled to the second input terminal, a second end coupled to the output terminal and a control end coupled to the ground via a third resistor. A third switch includes a first end coupled to the control end of the second switch and the first end of the third resistor, a second end coupled to the first input terminal and a control end coupled to the second input terminal and coupled to the ground via the first resistor.

16 Claims, 4 Drawing Sheets

POWER SWITCHING APPARATUS

CROSS REFERENCE TO RELATED APPLICATIONS

This application claims priority of U.S. provisional Application No. 62/894,984 filed on 2019 Sep. 3.

BACKGROUND

The present application is related to a power switching apparatus, and more particularly, to a power switching apparatus applied in a high-speed interface circuitry.

A power supply is an electronic device configured to provide a power to an electrical load. When designing and developing a system, the stability of the power providing to the electrical load is an issue to care and the power supply needs to be designed in consideration of different situations of the electrical load. For example, in High Definition Multimedia Interface (HDMI) application, when a source device (e.g., DVD player, personal computer or laptop) transmits a higher resolution of the video stream to the sink device (e.g., TV or monitor), the HDMI circuit implemented in the HDMI cable may need higher current (e.g., the current is required larger than 50 mA) to operate. If the current provided by the power supply is insufficient, the transmission could be unstable and cause unexpected results. Therefore, this disclosure provides a power supply having different options in providing voltages and currents to the electrical load to increases the flexibility and stability.

SUMMARY

The present disclosure provides a power switching apparatus which includes a first input terminal arranged to selectively receive a first input voltage, a second input terminal arranged to selectively receive a second input voltage, an output terminal arranged to output a supply voltage, a first to a third resistor, and a first to a third switch. The first resistor includes a first end coupled to the second input terminal and a second end coupled to a ground voltage. The second resistor includes a first end coupled to the output terminal and a second end coupled to the ground voltage. The third resistor includes a first end and a second end coupled to the ground voltage. The first switch includes a first end coupled to the first input terminal, a second end coupled to the output terminal and a control end coupled to the second input terminal and the first end of the first resistor. The second switch includes a first end coupled to the second input terminal, a second end coupled to the output terminal and a control end coupled to the first end of the third resistor. The third switch includes a first end coupled to the control end of the second switch and the first end of the third resistor, a second end coupled to the first input terminal and a control end coupled to the second input terminal and the first end of the first resistor.

The present disclosure also provides a power switching apparatus configured to output a supply voltage at an output terminal. The power switching apparatus includes a first switch configured to receive a first input voltage at a first input terminal and output the first input voltage as the supply voltage at the output terminal according to a first control voltage at a first control end of the first transistor; a second switch configured to receive a second input voltage at a second input terminal and output the second input voltage as the supply voltage at the output terminal according to a second control voltage at a second control end of the second transistor; and a third switch configured to receive the first input voltage and the second input voltage, and selectively output the first input voltage as the second control voltage at the control end of the second transistor.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
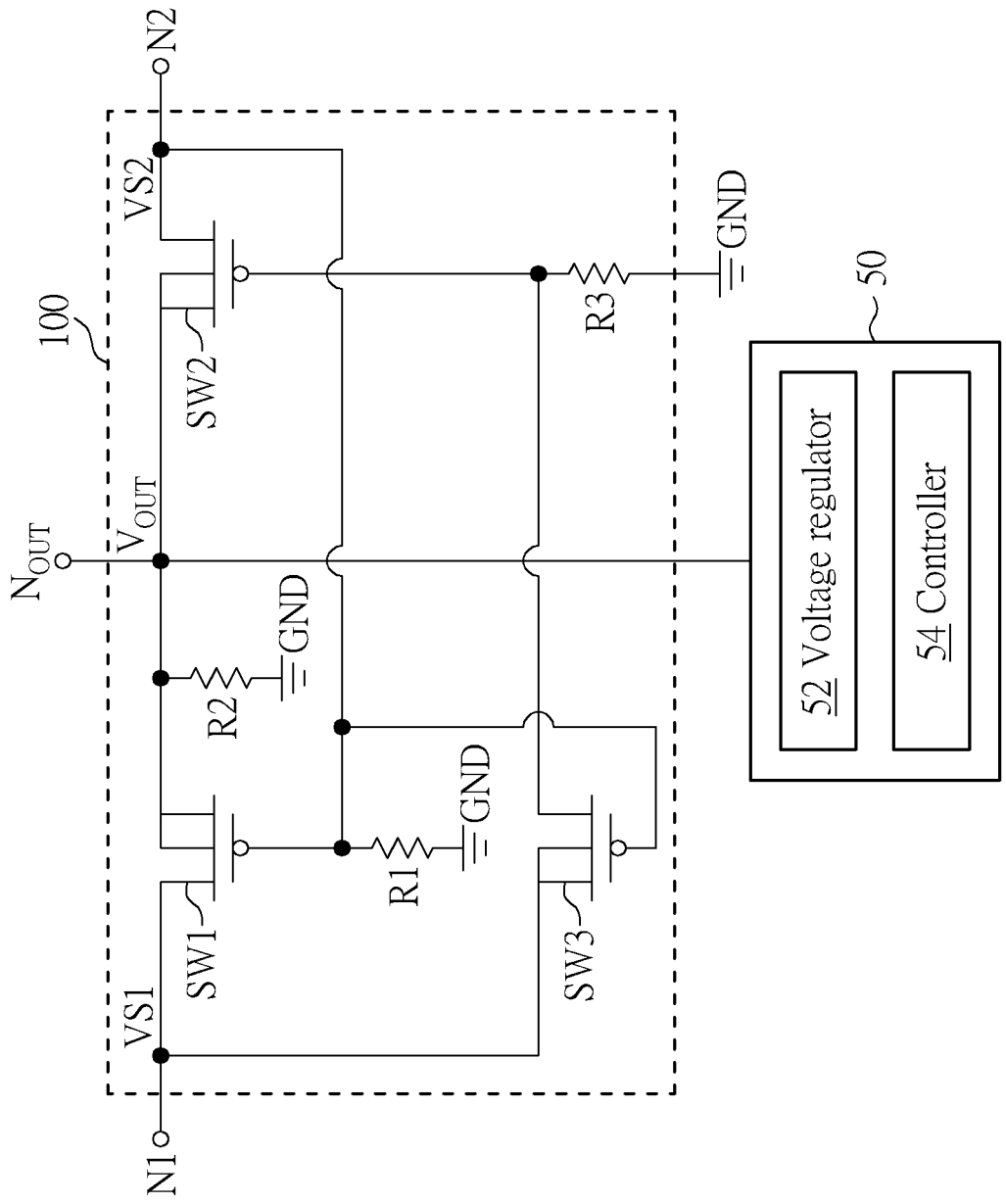
FIG. 1 is a diagram illustrating a power switching apparatus.

FIG. 1 is a diagram illustrating a power switching apparatus 100. The power switching apparatus 100 includes a first input terminal N1, a second input terminal N2, an output terminal $N_{OUT}$, switches SW1~SW3, and resistors R1~R3. The driving capability of the second input terminal N2 is greater than the driving capability of the first input terminal N1. In other words, the maximum current can be provided by the second input terminal N2 is larger than the maximum current can be provided by the first input terminal N1. The resistor R1 includes a first end coupled to the second input terminal N2 and a second end coupled to a ground voltage GND. The resistor R2 includes a first end coupled to the output terminal $N_{OUT}$ and a second end coupled to the ground voltage GND. The resistor R3 includes a first end and a second end coupled to the ground voltage GND. In some embodiments, the second end of the resistor R1, the second end of the resistor R2 and/or the second end of the resistor R3 can be coupled to another fixed voltage. The switch SW1 includes a first end coupled to the first input terminal N1, a second end coupled to the output terminal $N_{OUT}$, and a control end coupled to the second input terminal N2 and the first end of the resistor R1. The switch SW2 includes a first end coupled to the second input terminal N2, a second end coupled to the output terminal $N_{OUT}$, and a control end coupled to the first end of the resistor R3. The switch SW3 includes a first end coupled between the control end of the switch SW2 and the first end of the resistor R3, a second end coupled to the first input terminal N1, and a control end coupled to the second input terminal N2 and the first end of the resistor R1.

Each of the switches SW1~SW3 may be selectively turned on or turned off according to the voltage generated on its control end. In an embodiment of the present disclosure, each of the switches SW1~SW3 can be implemented by a P-type transistor, such as a P-type metal-oxide-semiconductor field-effect transistor (MOSFET) or other device with similar function. In some embodiments, the switches SW1, SW2, and SW3 may be implemented using N-type MOSFET. The first end and the second end refer to the drain terminal or the source terminal, and the control end refers to the gate terminal. Referring to FIG. 1, the switches are implements by P-type transistor, when the gate-to-source voltage $V_{GS}$ is larger than the threshold voltage $V_{TH}$, the switch is turned off and no conduction between the drain and source terminals. Contrarily, when the gate-to-source voltage $V_{GS}$ is smaller than the threshold voltage $V_{TH}$, the switch is turned on and a channel is formed between the drain and source terminals such that the current can flow through.

Furthermore, each of the switches SW1~SW3 includes a third end referring to body terminal. In some embodiments, the third end of the switch may be coupled to its first end, second end or a voltage source. The connection of the third end illustrated in FIG. 1 is an embodiment.

During the operation of the power switching apparatus 100, a first input voltage VS1 may be selectively provided to the first input terminal N1, and a second input voltage VS2 may be selectively provided to the second input terminal N2. According to the first input voltage VS1 provided to the first input terminal N1 and/or the second input voltage VS2 provided to the second input terminal N2, the power switching apparatus 100 is configured to output a supply voltage $V_{OUT}$ on the output end $N_{OUT}$.

The power switching apparatus 100 may be implemented in an HDMI cable. Some types of HDMI cables may have two ports in each end: an HDMI port and a USB port. The power switching apparatus 100 is coupled to a power pin of the HDMI port and a power pin of the USB port, such that the power can be provided from either HDMI port or USB port. Therefore, the first input voltage VS1 can be provided from the power pin of the HDMI port and the second input voltage VS2 can be provided from the power pin of the USB port. The power switching apparatus 100 can output either the first input voltage VS1 or the second input voltage VS2 as the supply voltage $V_{OUT}$ to a circuitry 50. In some embodiments, the circuitry 50 is an HDMI circuitry including a voltage regulator 52 and a controller 54. In some embodiments, the power switching apparatus 100 is implemented on a printed-circuit board (PCB) and the circuitry 50 is implemented by a chip. In some embodiments, the first input voltage VS1 and second input voltage VS2 can be the same or different.

Figure 2:
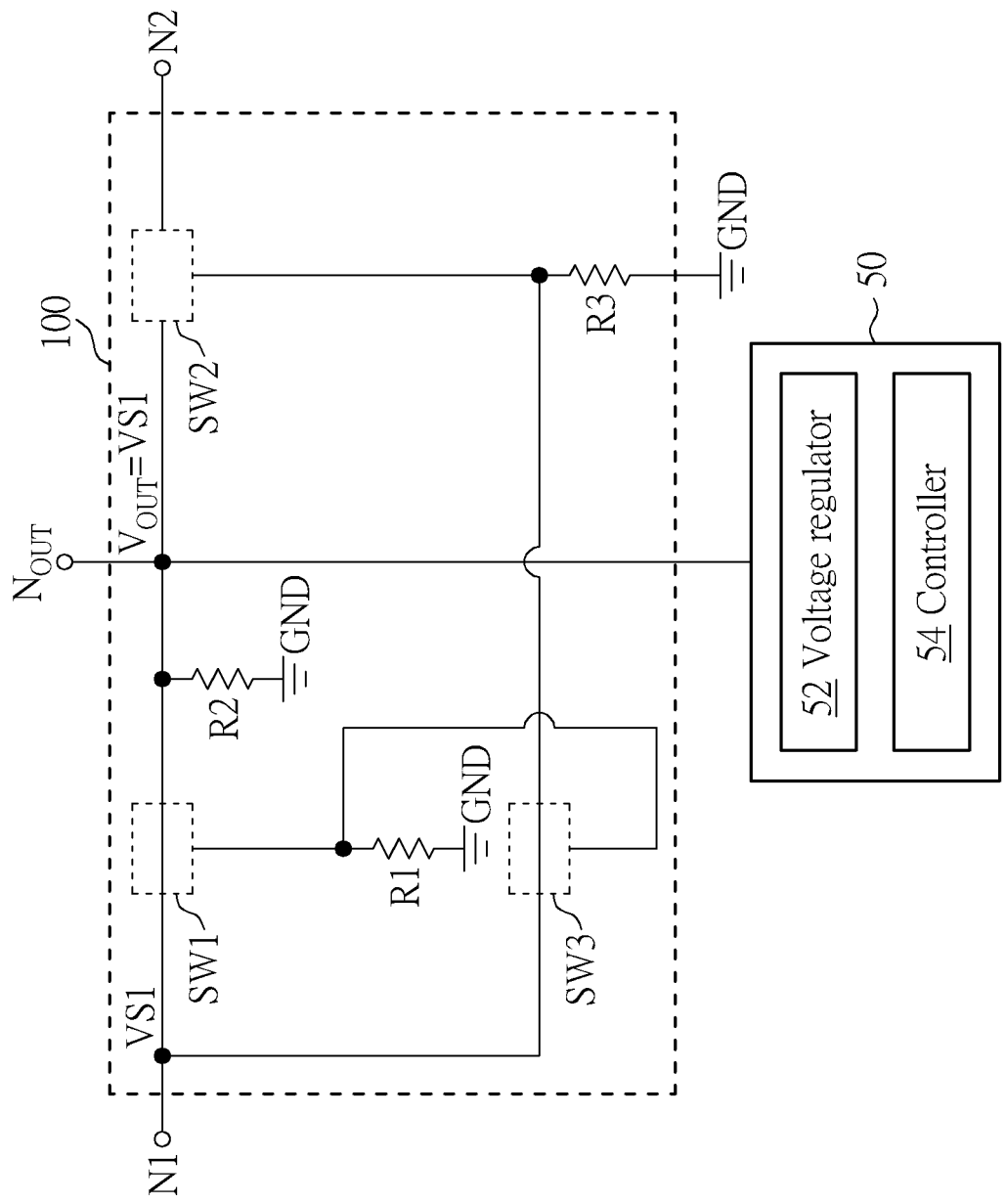
FIG. 2 is a diagram illustrating an equivalent circuit of the power switching apparatus operating in a first scenario.

FIG. 2 is a diagram illustrating an equivalent circuit of the power switching apparatus 100 when operating in a first scenario. In the first scenario, the first input voltage VS1 is provided to the first input terminal N1, but the second input voltage VS2 is not provided to the second input terminal N2. Without any input from the second input terminal N2, the control end of the switch SW1 is biased at the ground voltage GND via the resistor R1, thereby resulting in a gate-to-source voltage $V_{GS1}$ smaller than the threshold voltage $V_{TH1}$ of the switch SW1 and thus turning on the switch SW1. Similarly, the control end of the switch SW3 is biased at the ground voltage GND via the resistor R1, thereby generating a gate-to-source voltage $V_{GS3}$ smaller than the threshold voltage $V_{TH3}$ of the switch SW3 and the switch SW3 is turned on. Meanwhile, the control end of the switch SW2 is biased at the first input voltage VS1 via the turned-on transistor M3 and the second end of the switch SW2 is biased at the first input voltage VS1 via the turned-on switch SW1, thereby generating a gate-to-source voltage $V_{GS2}$ ($V_{GS2}$=0) larger than the threshold voltage $V_{TH2}$ of the switch SW2 and the switch SW2 is turned off. In this scenario, the supply voltage $V_{OUT}$ outputted at the output terminal $N_{OUT}$ will be the first input voltage VS1.

Figure 3:
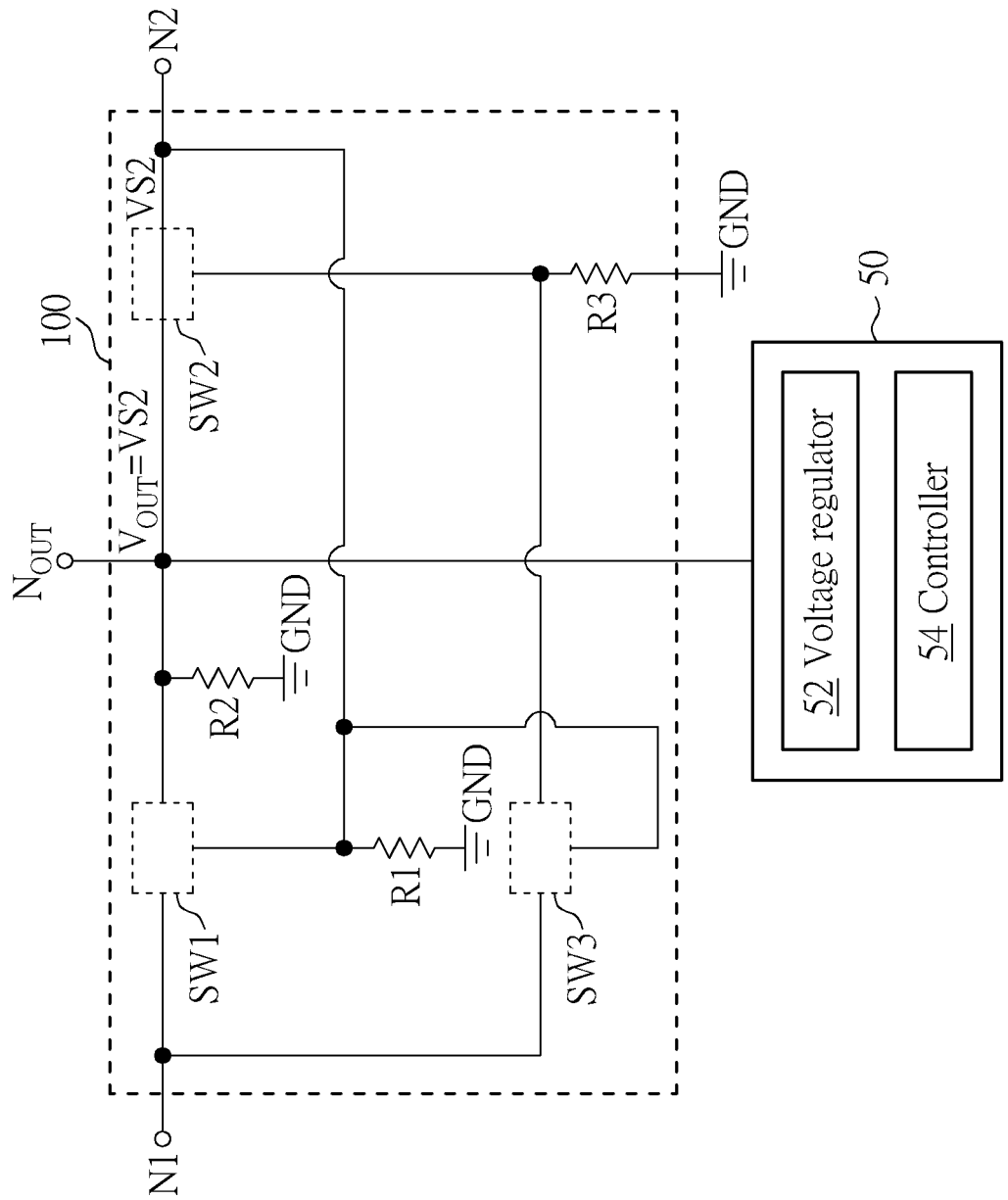
FIG. 3 is a diagram illustrating an equivalent circuit of the power switching apparatus operating in a second scenario.

FIG. 3 is a diagram illustrating an equivalent circuit of the power switching apparatus 100 when operating in a second scenario. In the second scenario, the second input voltage VS2 is provided to the second input terminal N2, but the first input voltage VS1 is not provided to the first input terminal N1. With the second input terminal N2 receiving the second input voltage VS2, the control end of the switch SW1 is biased at the second input voltage VS2, thereby generating a gate-to-source voltage $V_{GS1}$ larger than the threshold voltage $V_{TH1}$ of the switch SW1 and the switch SW1 is turned off. Similarly, the control end of the switch SW3 is biased at the second input voltage VS2, thereby generating a gate-to-source voltage $V_{GS3}$ larger than the threshold voltage $V_{TH3}$ of the switch SW3 and the switch SW3 is turned off. With the switch SW3 turned off, the control end of the switch SW2 is biased at the ground voltage GND via the resistor R3, thereby generating a gate-to-source voltage $V_{GS2}$ smaller than the threshold voltage $V_{TH2}$ of the switch SW2 and the switch SW2 is turned on. In this scenario, the supply voltage $V_{OUT}$ outputted at the output terminal $N_{OUT}$ will be the second input voltage VS2.

Figure 4:
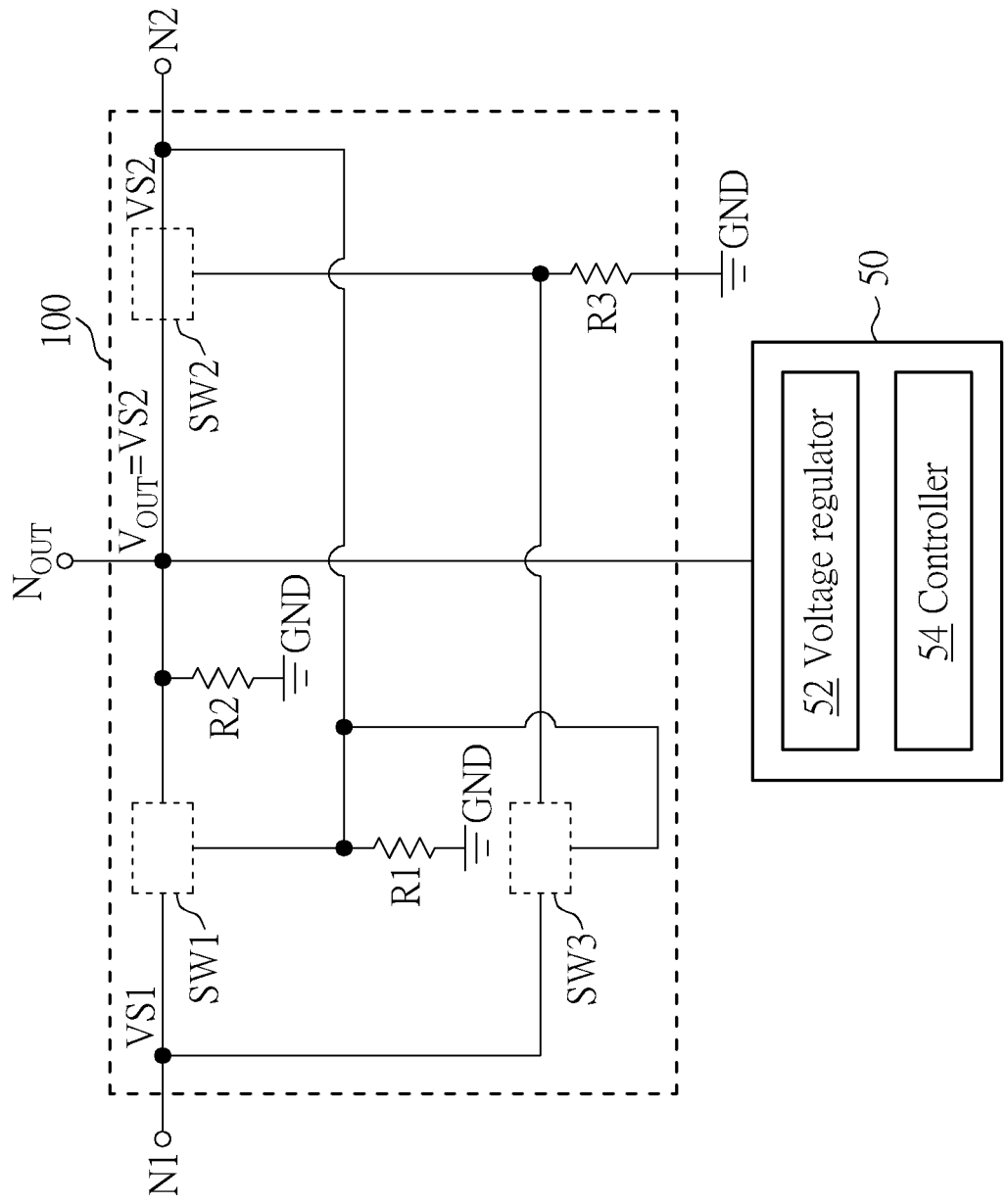
FIG. 4 is a diagram illustrating an equivalent circuit of the power switching apparatus operating in a third scenario.

FIG. 4 is a diagram illustrating an equivalent circuit of the power switching apparatus 100 when operating in a third scenario. In the third scenario, the first input voltage VS1 is provided to the first input terminal N1, and the second input voltage VS2 is also provided to the second input terminal N2. In one embodiment, the threshold voltages $|V_{TH1}|$, $|V_{TH2}|$ and $|V_{TH3}|$ are 0.7V, the first input voltage VS1 is 5V and the second input voltage VS2 is 5V. When the first input terminal N1 receives the first input voltage VS1 and the second input terminal N2 receives the second input voltage VS2 at the same time, the control end of the switch SW1 is biased at the second input voltage VS2, thereby generating a gate-to-source voltage $V_{GS1}$ larger than the threshold voltage $V_{TH1}$ of the switch SW1 and the switch SW1 is turned off. Similarly, the control end of the switch SW3 is biased at the second input voltage VS2, thereby generating a gate-to-source voltage $V_{GS3}$ larger than the threshold voltage $V_{TH3}$ of the switch SW3 and the switch SW3 is turned off. When the switch SW3 is turned off, the control end of the switch SW2 is biased at the ground voltage GND via the resistor R3, thereby generating a gate-to-source voltage $V_{GS2}$ smaller than the threshold voltage $V_{TH2}$ of the switch SW2 and the switch SW2 is turned on. In this scenario, when the first input terminal N1 receives the first input voltage VS1 and the second input terminal N2 receives the second input voltage VS2 at the same time, the supply voltage $V_{OUT}$ outputted at the output terminal $N_{OUT}$ will be the second input voltage VS2. In other words, based on the structure of the power switching apparatus 100, the second input terminal N2 has higher priority than the first input terminal N1, the power switching apparatus 100 selects the second input voltage VS2 as the supply voltage $V_{OUT}$ when the first input voltage VS1 and the second input voltage VS2 are provided to the first input terminal N1 and the second input terminal N2 at the same time. As the driving capability generated from the second input terminal N2 is larger than the driving capability generated from the first input terminal N1, where the maximum current provided from the second input terminal N2 is higher than the maximum current provided from the first input terminal N1, the circuitry 50 can use more current to maintain the stability.

In conclusion, the present power switching apparatus 100 may provide a supply voltage $V_{OUT}$ for driving the circuitry 50 according to the first input voltage VS1 provided to the first input terminal N1 and/or the second input voltage VS2 provided to the second input terminal N2. Based on different scenarios, whether the first input voltage VS1 and/or the second input voltage VS2 are provided, the present power switching apparatus 100 can selectively output the first input voltage VS1 or the second input voltage VS2 as the supply voltage $V_{OUT}$ to the circuitry 50.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A power switching apparatus, comprising:
a first input terminal arranged to receive a first input voltage;
a second input terminal arranged to receive a second input voltage;
an output terminal arranged to output a supply voltage;
a first resistor, comprising:
a first end coupled to the second input terminal; and
a second end coupled to a first predetermined voltage;
a second resistor; comprising:
a first end coupled to the output terminal; and
a second end coupled to a second predetermined voltage;
a third resistor, comprising:
a first end; and
a second end coupled to a third predetermined voltage;
a first switch, comprising:
a first end coupled to the first input terminal;
a second end coupled to the output terminal; and
a control end coupled to the second input terminal and the first end of the first resistor;
a second switch, comprising:
a first end coupled to the second input terminal;
a second end coupled to the output terminal; and
a control end coupled to the first end of the third resistor; and
a third switch, comprising:
a first end coupled to the control end of the second switch and the first end of the third resistor;
a second end coupled to the first input terminal; and
a control end coupled to the second input terminal and the first end of the first resistor;
wherein the power switching apparatus is further configured to output the supply voltage to a high-definition multimedia interface (HDMI) circuitry which includes a voltage regulator and a controller;
wherein the first input voltage is supplied by a power pin of a HDMI port; and
wherein the second input voltage is supplied by a power pin of a USB port.

2. The power switching apparatus of claim 1, configured to operate in a first scenario when the first input voltage is provided to the first input terminal alone, wherein:
the first switch is turned on and configured to couple the first input terminal to the output terminal, thereby providing the first input voltage as the supply voltage; and
the third switch is turned on and configured to bias the control end of the second switch at the first input voltage to turn off the second switch.

3. The power switching apparatus of claim 1, configured to operate in a second scenario when the second input voltage is provided to the second input terminal alone, wherein:
the first switch and the third switch are turned off by the second input voltage; and
the second switch is turned on and configured to couple the second input terminal to the output terminal, thereby providing the second input voltage as the supply voltage.

4. The power switching apparatus of claim 1, configured to operate in a third scenario when the first input voltage is provided to the first input terminal and the second input voltage is provided to the second input terminal at a same time, wherein:
the first switch and the third switch are turned off by the second input voltage; and
the second switch is turned on and configured to couple the second input terminal to the output terminal, thereby providing the second input voltage as the supply voltage.

5. The power switching apparatus of claim 1, wherein the first switch, the second switch and the third switch are implemented by P-type transistors.

6. The power switching apparatus of claim 1, wherein the first switch, the second switch and the third switch are implemented by N-type transistors.

7. The power switching apparatus of claim 1, wherein a driving capability of the second input terminal is greater than a driving capability of the first input terminal.

8. The power switching apparatus of claim 1, wherein the first predetermined voltage, the second predetermined voltage and the predetermined voltage are the same.

9. The power switching apparatus of claim 1, wherein the first predetermined voltage, the second predetermined voltage and the predetermined voltage are a ground voltage.

10. A power switching apparatus configured to output a supply voltage at an output terminal, comprising:
a first switch configured to receive a first input voltage at a first input terminal and output the first input voltage as the supply voltage at the output terminal according to a first control voltage at a first control end of the first transistor;
a second switch configured to receive a second input voltage at a second input terminal and output the second input voltage as the supply voltage at the output terminal according to a second control voltage at a second control end of the second transistor; and
a third switch configured to receive the first input voltage and the second input voltage, and selectively output the first input voltage as the second control voltage at the control end of the second transistor;
wherein the power switching apparatus is further configured to output the supply voltage to a high-definition multimedia interface (HDMI) circuitry which includes a voltage regulator and a controller;
wherein the first input voltage is supplied by a power pin of a HMI: port; and
wherein the second input voltage is supplied by a power pin of a USB port.

11. The power switching apparatus of claim 10; configured to operate in a first scenario when the first input voltage is provided to the first input terminal alone, wherein:
the first switch is turned on and configured to couple the first input terminal to the output terminal, thereby proving the first input voltage as the supply voltage; and
the third switch is turned on and configured to bias the control end of the second switch at the first input voltage to turn off the second switch.

12. The power switching apparatus of claim 10, configured to operate in a second scenario when the second input voltage is provided to the second input terminal alone, wherein:
the first switch and the third switch are turned off; and
the second switch is turned on and configured to couple the second input terminal to the output terminal, thereby providing the second input voltage as the supply voltage.

13. The power switching apparatus of claim 10, configured to operate in a third scenario when the first input voltage is provided to the first input terminal and the second input voltage is provided to the second input terminal at a same time, wherein:
  the first switch and the third switch are turned off; and
  the second switch is turned on and configured to couple the second input terminal to the output terminal, thereby providing the second input voltage as the supply voltage.

14. The power switching apparatus of claim 10, wherein the first switch, second switch and the third switch are implemented by P-type transistors.

15. The power switching apparatus of claim 10, wherein the first switch, the second switch and the third switch are implemented by N-type transistors.

16. The power switching apparatus of claim 10, wherein a driving capability of the second input terminal is greater than a driving capability of the first input terminal.

* * * * *